United States Patent [19]
Cerra

[11] 4,293,825
[45] Oct. 6, 1981

[54] FREQUENCY-SHIFTING SYSTEMS FOR FREQUENCY MODULATED SIGNALS

[75] Inventor: Raffaele Cerra, Naples, Italy

[73] Assignee: Selenia Industrie Elettroniche Associate S.p.A., Italy

[21] Appl. No.: 30,267

[22] Filed: Apr. 13, 1979

[30] Foreign Application Priority Data

Apr. 18, 1978 [IT] Italy ............................... 48945 A/78

[51] Int. Cl.³ .............................................. H03L 7/06
[52] U.S. Cl. ........................................ 331/2; 328/15; 331/23; 455/22; 455/118; 455/131; 455/316
[58] Field of Search ................ 331/2, 23, 25; 328/15; 455/20, 22, 118, 131, 313, 314, 315, 316, 323

[56] References Cited

U.S. PATENT DOCUMENTS

3,249,886  5/1966  Anderson et al. ............... 331/25 X
3,680,004  7/1972  Poussin ............................. 331/23 X
3,691,394  9/1972  Davis ................................ 328/15 X

*Primary Examiner*—Siegfried H. Grimm

*Attorney, Agent, or Firm*—Beveridge, DeGrandi, Kline & Lunsford

[57] ABSTRACT

A system of frequency-shifting of frequency modulated signals, continuously above or below a pre-established frequency, the shift being possibly also null. The system includes a source of frequency modulated signals, the frequency of which is to be shifted; a reference oscillator; a first phase locked loop to which is applied the signals from the signal source and the output of the reference oscillator, the arrangement being such that the first phase locked loop will be locked to a conversion frequency above or below the frequency of the signal source. The output of the first phase locked loop is applied to a second phase locked loop together with a variable frequency signal produced by an oscillator which can be frequency controlled, the arrangement being such that the second phase locked loop will be locked to a conversion frequency above or below that of the first phase locked loop so that the output frequency of the second phase locked loop will be greater than, equal to, or less than the frequency of the signal source according to the value of the frequency of the frequency controllable oscillator.

1 Claim, 8 Drawing Figures

FREQUENCY-SHIFTING SYSTEMS FOR FREQUENCY MODULATED SIGNALS

The present invention relates to an improvement in frequency-shifting systems for frequency modulated signals.

More particularly, the present invention is concerned with a system for the frequency shifting of frequency modulated signals, continuously above or below a pre-established frequency, with the shift also being able to have, for its excursion, a null value.

In the known art, such a frequency shift was effected by single lateral band modulation, as will be better illustrated later on. This technique has several appreciable drawbacks.

The present invention obviates drawbacks of known techniques by utilizing two cascade arranged phase locked circuits.

The system according to the present invention will be now described with reference to one embodiment thereof, at present preferred and illustrated by way of non limitative example, with reference to the figures of the attached drawings, where:

Figure 1:
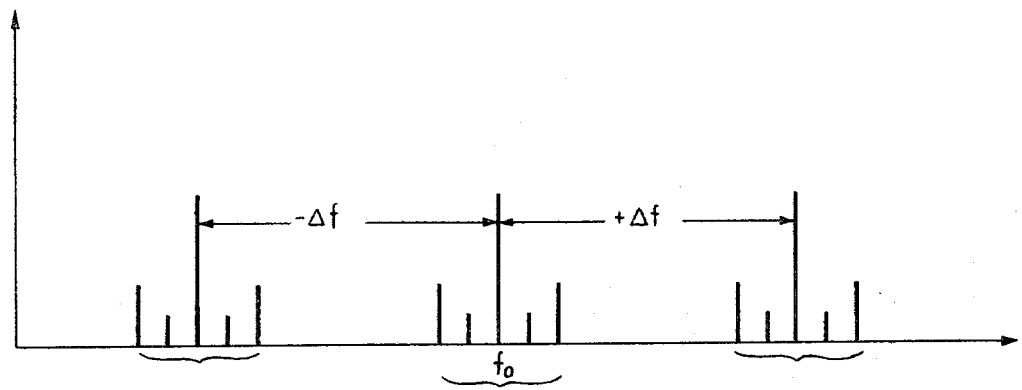
FIG. 1 shows a diagram of amplitudes/frequencies illustrating the problem which is intended to be solved by the present invention.

Let us consider the problem of the shift of frequency modulation spectra deriving from having frequency modulated a carrier $f_o$ (FIG. 1). Let us assume that a $\pm\Delta f$ shift is wanted. We shall have therefore two spectra F1, F2, centered on $f_o+\Delta f$ and $f_o-\Delta f$ respectively.

Figure 2:
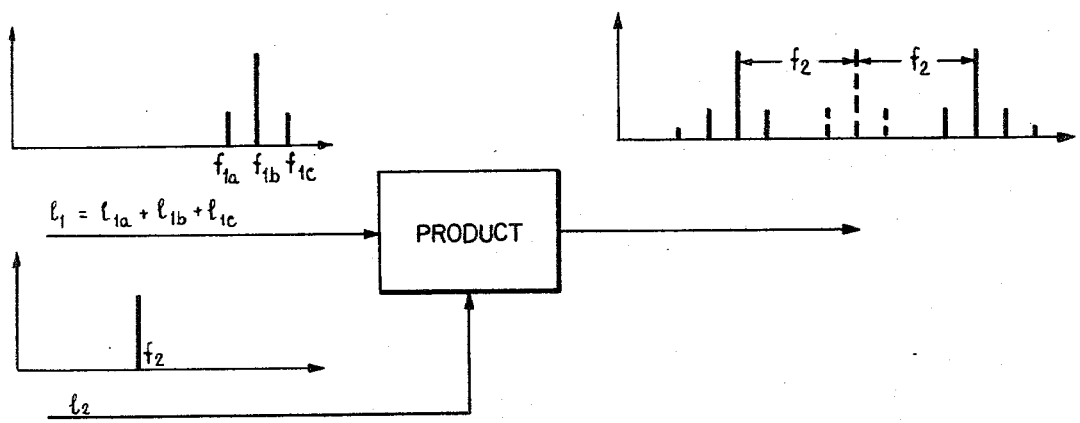
FIG. 2 shows the block diagram of a suppressed-carrier ideal modulator.
Figure 3:
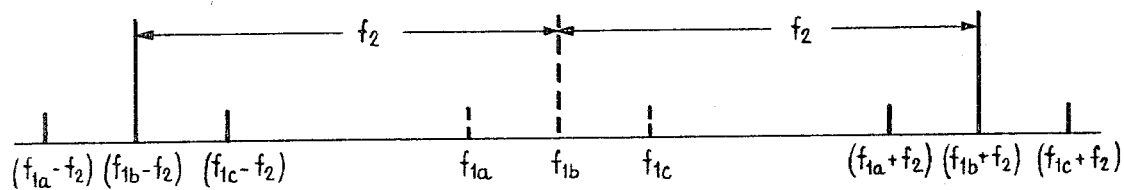
FIG. 3 shows the output spectra of a suppressed-carrier ideal modulator.

A method presently used for obtaining the above mentioned shift is the one of using the suppressed-carrier technique.

$$l_1\ l_{1a}$$

$$l_1 = l_{1a} + l_{1b} + l_{1c}$$

to which corresponds the spectrum $f_{1a}, f_{1b}, f_{1c}$, and of the wave $$l_2$$

to which corresponds a frequency $f_2$ corresponding to the wanted shift $\Delta f$. At the output from the product circuit shown in FIG. 2, the wave will be obtained:

$$l_u = l_{1a}\cdot l_2 + l_{1b}\cdot l_2 + l_{1c}\cdot l_2$$

the spectrum of which is illustrated in FIG. 3, for which no particular explanation is required.

Thus, two spectra similar to the initial one are obtained, located symmetrically with respect to said initial spectrum and spaced apart through a (frequency) distance equalling $2f_2$.

Figure 4:
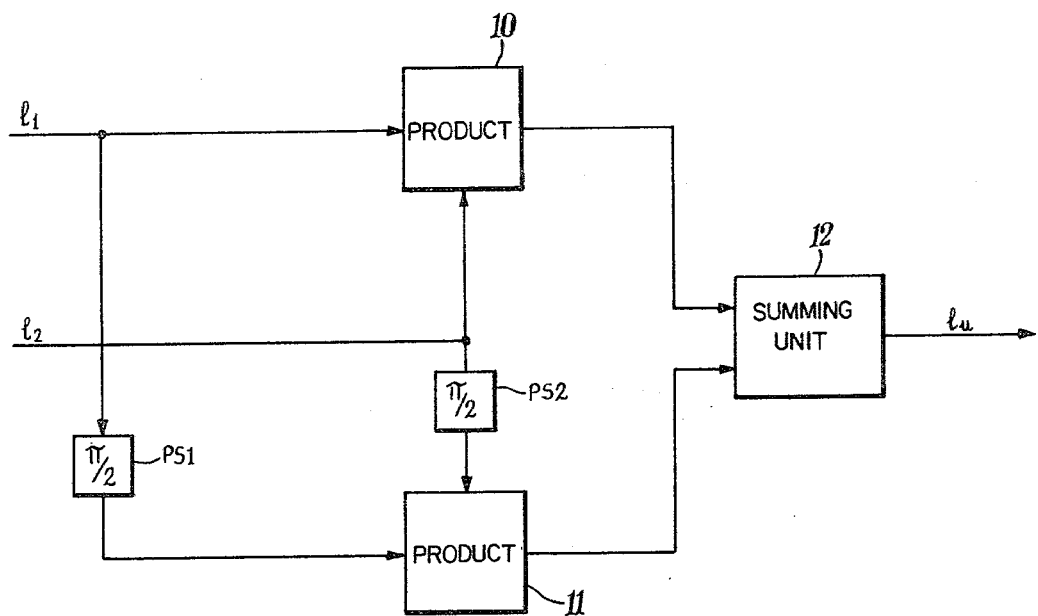
FIG. 4 shows the ideal diagram of a single sideband modulator.

By means of known techniques it is possible to suppress one of the shifted spectra, obtaining therefore the wanted spectrum shifted, with respect to the original spectrum, through the frequency $f_2$. One example of a circuit of this kind is illustrated in FIG. 4. With reference to this figure the signals $l_1, l_2$ are brough to a first product circuit 10 and, after a phase shift through $\pi/2$ in the phase shifters PS1 and PS2, to a second product circuit 11.

The outputs of circuits 10 and 11 are brought to a summing unit 12 at the output of which there is available the wanted lateral band $l_u$.

This prior art shows various drawbacks mainly connected to the fact that:

(a) the multiplication operation in the product circuits 10, 11 cannot be obtained in a perfect way, whereby the starting spectrum is not completely suppressed, and there is the generation of unwanted lines (intermodulation products)

(b) also the operation of phase shift in the circuits PS1, PS2 and of addition in the circuit 12 cannot be obtained perfectly, and therefore it is impossible to completely suppress the unwanted spectrum.

Furthermore, it is possible to note that the shift cannot be effected rightwards or leftwards with respect to the wanted spectrum by the single device, but only towards one of the two directions. Also, the amplitude of the unwanted lines depends upon the amplitude of the input waves.

Figure 5:
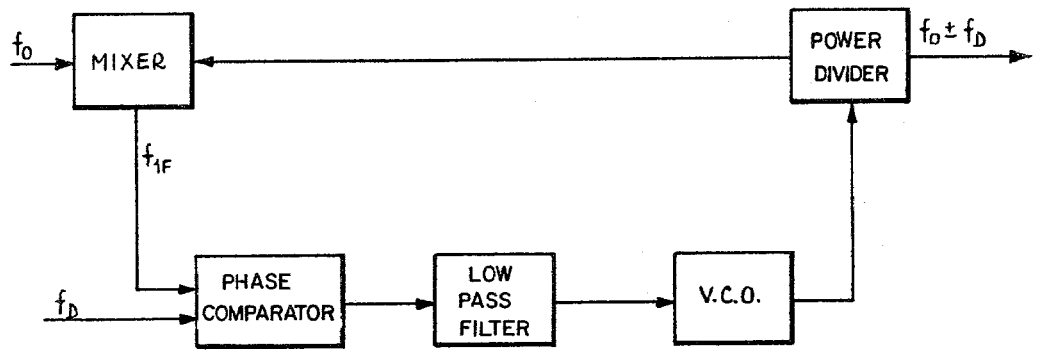
FIG. 5 shows the typical diagram of a phase locked "loop"

Another known method for frequency shift of a spectrum FM consists in adopting a phase locked loop as shown diagrammatically in FIG. 5.

If a wave having a frequency $f_o$ and the spectrum connected thereto are to be shifted through an amount $$\Delta f = f_D,$$

when the "loop" is locked, the frequency $f_{1F}$ is necessarily equal to $f_D$ and the frequency of the output wave is shifted with respect to $f_o$ through an amount $f_D$. The output frequency is $f_o+f_D$ or $f_o-f_D$, according to whether the locking is caused to occur at the upper or lower image frequency.

In order that the frequency modulations present on $f_o$ will be shifted on the output wave almost unaltered, it is necessary that the "loop" have a modulating band $B_{eq}$ such that, the maximum modulating frequency $$B_{eq} > (2 \div 3) f_m$$

and that the damping $\zeta$ be $$\zeta > 2 \div 3$$

On the other hand it is known that by a phase locked "loop" it is impossible to obtain frequency shifts $\Delta f <$ than about 5 $B_{eq}$ due to the difficulties found in sufficiently attenuating the signals appearing at the output of the phase comparator (see, in this connection: F. M. Gardner "Phase Lock Techniques", J. Wiley and W. Manasse Witsch "Frequency Synthetizers").

Thus, as the width of the band of the "loop" must be small, with respect to the frequency shift which is wanted, there exists also a limitation in the noise band, as cancelled by the "loop". This method, therefore, can be utilized only when the wanted frequency shift is large with respect to the maximum modulating frequency $f_m$. It is to be noted that by means of this system only frequency shifts rightwards or leftwards can be obtained with respect to the starting spectrum.

Figure 6A:
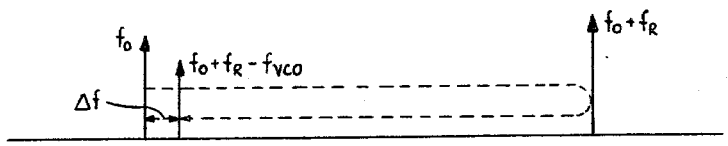
FIG. 6a shows the frequencies of the circuit of FIG. 6.
Figure 6:
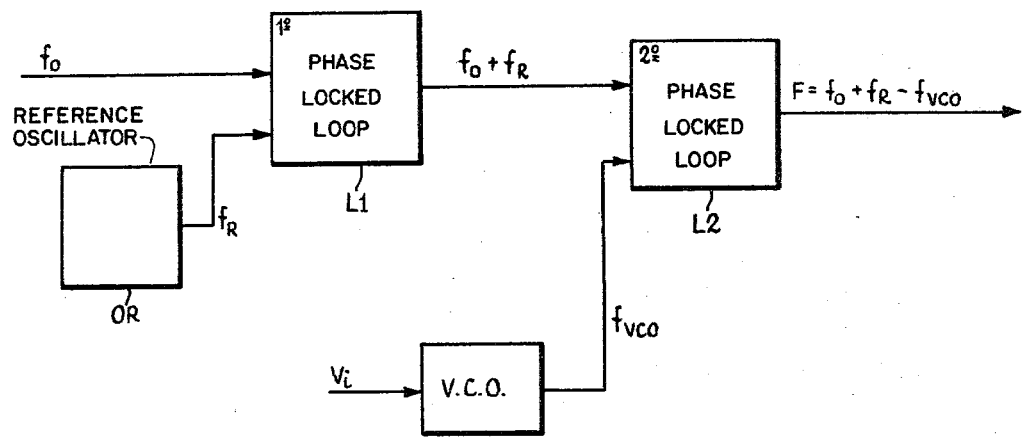
FIG. 6 shows the block diagram of two phase locked "loops" serially arranged according to the present invention.

The solution adopted according to the present invention is diagrammatically illustrated in FIG. 6. As can be observed in FIG. 6, two lage band phase locked "loops" L1, L2 are provided. The first phase locked "loop" L1 receives the frequency $f_o$ and the reference frequencies $f_R$ coming from a reference oscillator OR and is pre-disposed to lock to the sum frequency $f_o+f_R$. The second phase locked "loop" L2 receives the sum frequency $f_o+f_R$ coming from the first phase locked "loop" and a frequency $f_{vco}$ coming from a variable frequency oscillator VCO controlled, for instance, by a control voltage Vi.

The phase locked "loop" L2 is so arranged as to lock to the difference frequency between the two input frequencies $(f_o+f_R)$ and $f_{vco}$.

Therefore, at the output from the second phase locked "loop" a frequency $F=(f_o+f_R)-f_{vco}$, is available. The difference $f_R-f_{vco}$ (positive or negative) determines the upward or downward shift of the output frequency F of the system, with respect to the input frequency. Thus, if for instance $f_R=f_{vco}$ we will have $F=f_o$, if $f_{vco}>f_R$, then $F<f_o$ and vice-versa. Consequently, it is possible to cause the variation of the frequency F under the control of the voltage Vi above and under the input $f_o$, being possible also to obtain for F a value identical to that of $f_o$.

The graphical relation of these frequencies is illustrated in FIG. 6a.

The contrivance according to this invention of using two serially arranged phase locked "loops" allows:

(a) using reference frequencies $f_R$ and $f_{vco}$ sufficiently high with respect to the maximum possible modulating frequency $f_m$ and $f_o$ to cause the "ripple" of the phase comparators to have such a high frequency as to be easily attenuated by the low pass filter of the "loop";

(b) using, consequently, phase locked "loops" having a sufficiently wide band as to allow FM modulation on the input wave $f_o$, on the output wave F;

(c) cancelling, due to the large band, the circuital noise and the noise of the oscillator V.C.O. so that the frequency noise present at the output will be practically only that present on the input wave;

(d) shifting, due to the large bands, the output frequency F by the shift of the $f_{vco}$ of the "loop" L2 at high speeds;

(e) obtaining continuously positive, null, or negative frequency shifts F with respect to $f_o$, a result which was not possible by the known techniques;

(f) achieving with respect to the modulation systems that both the carrier wave and the lateral band are actually absent at the output and not suppressed to a more or less high degree, depending upon the quality of the circuits.

The arrangement according to the present invention finds a particular use in the simulation of the echoes of c.w. doppler radar.

One example of such use will be now described.

It is known that the wave $f_r$ reflected by a target, is affected with respect to the transmitted wave $f_o$, by a frequency shift (doppler effect), given by $$f_D = \frac{2V_r}{\lambda} = 2 V_r \frac{f_o}{c}$$

where
$V_r$=the relative speed toward or away;
$\lambda$=the wave length;
c=the velocity of light It is also known that it is extremely useful, starting from the transmitted wave $f_o$, to simulate in the laboratory the reflected wave $f_r$ of a determined target.

The relative doppler shift is $$f_D/f_o = 2\frac{V_r}{c}$$

which, for
$V_r$=150 m/sec
c=$3.10^8$ m/sec
takes the value $$f_D/f_o = \frac{2 \cdot 150}{3 \cdot 10^8} = 10^{-6}$$

The relative width of the frequency spectrum, by which the transmitted wave can be affected, for both intentional modulations and noises, can be $$(\Delta f_s)/f_o \approx 10^{-5}$$

It is clear that, by said values of $f_D/f_o$ and $\Delta f_s/f_o$ the methods used up to now are no more reliable.

Figure 7:
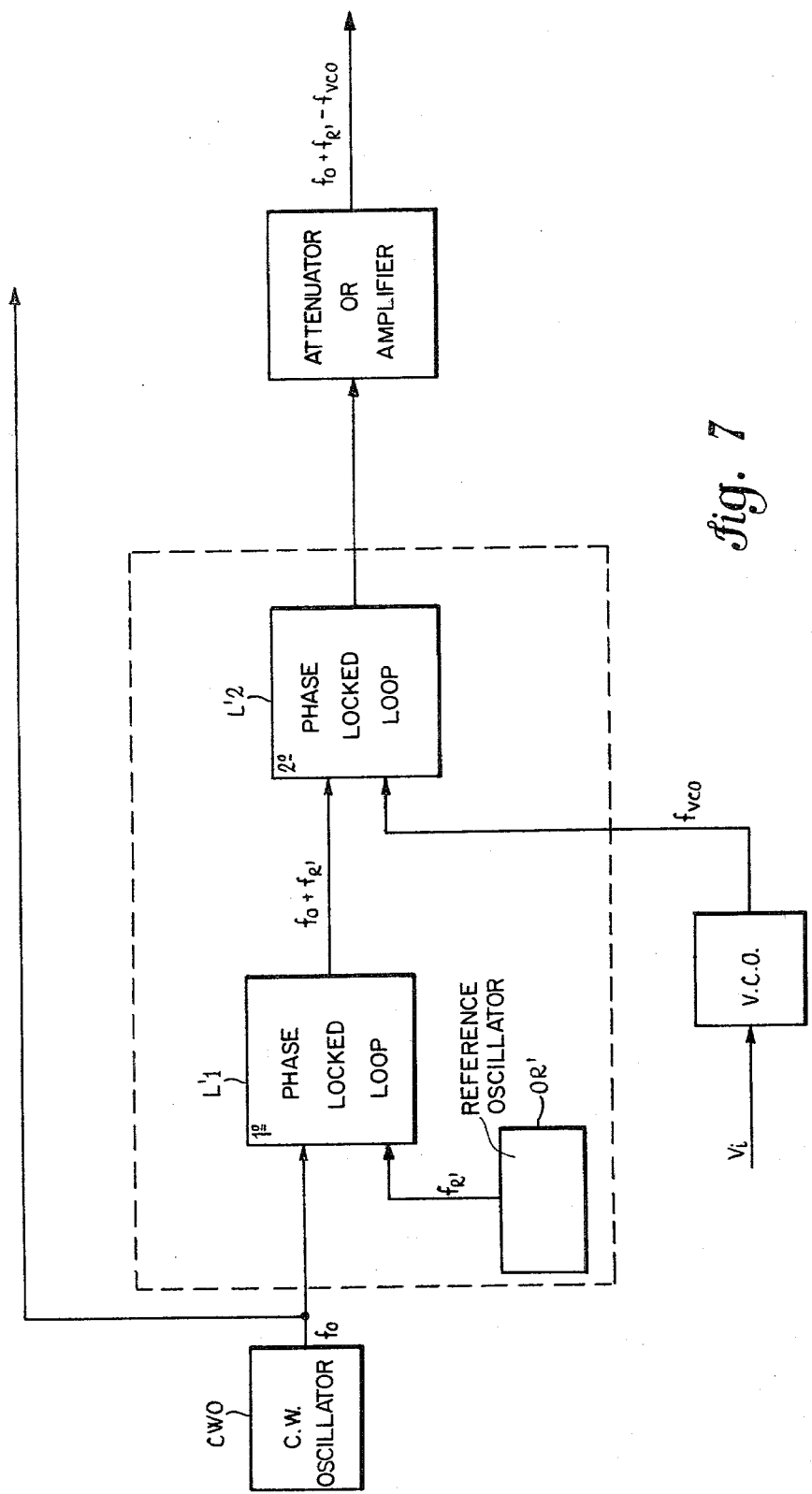
FIG. 7 shows a utilization diagram of the circuitry of FIG. 6 for simulating the echo of c w doppler radar.

By the arrangement according to the present invention, illustratively shown in FIG. 7, it is possible to obtain actually a spectrum FM similar to the start spectrum, and frequency shifted (either positively or negatively) through any desired amount, even very small, and at the limit, null.

As shown in FIG. 7, there is a c.w. transmitter CWO emitting a frequency modulated wave $f_o$.

A first phase locked "loop" L'1 with its relative reference oscillator OR', as previously described, produces a wave having the frequency $f_o+f_{R'}$ which is applied to the second phase locked "loop" L'2 together with the wave $f_{vco}$ of an oscillator V.C.O. controlled by a voltage Vi.

The output of the second phase locked "loop" is applied to an attenuator or amplifier, the output from which is the shifted wave $f_o+f_R-f_{vco}$ as wanted.

The present invention has been described with reference to one embodiment thereof at present preferred, and it will be understood that variations and modifications can be practically entered, without thereby departing from the scope of the present industrial privilege.

Having thus described the present invention, what is claimed is:

1. A system of frequency shifting of frequency modulated signals, continuously above or below a pre-established frequency, said shift being possibly also null, characterized in comprising: a source of frequency modulated signals, the frequency of which is to be shifted; a reference oscillator; a first phase locked loop to which is applied the signals from said source and the output of said reference oscillator, the arrangement being such that said first phase locked loop is locked to a first conversion frequency differing by the oscillator output frequency from the frequency of said signal source; a controlled frequency oscillator; a second phase locked loop having the output of said first phase locked loop applied thereto together with the output of said controlled frequency oscillator, the arrangement being such that said second phase locked loop is locked to a second conversion frequency differing from that of said first phase locked loop such that the output frequency of said second phase locked loop is greater than, equal to, or less than the frequency of said signal source according to the value of the frequency of said controlled frequency oscillator.

* * * * *